(12) United States Patent
Kim et al.

(10) Patent No.: US 6,954,387 B2
(45) Date of Patent: Oct. 11, 2005

(54) DYNAMIC RANDOM ACCESS MEMORY WITH SMART REFRESH SCHEDULER

(75) Inventors: Hoki Kim, Hopewell Junction, NY (US); Toshiaki Kirihata, Poughkeepsie, NY (US); David R. Hanson, Brewster, NY (US); Gregory J. Fredeman, Staatsburg, NY (US); John Golz, Garrison, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 10/604,375

(22) Filed: Jul. 15, 2003

(65) Prior Publication Data

US 2005/0013185 A1 Jan. 20, 2005

(51) Int. Cl.[7] ............................. G11C 7/00; G11C 8/00
(52) U.S. Cl. .............. 365/189.12; 365/222; 365/230.03
(58) Field of Search ........................... 365/189.12, 222, 365/230.03

(56) References Cited

U.S. PATENT DOCUMENTS

| | | | |
|---|---|---|---|
| 5,802,555 A | * | 9/1998 | Shigeeda .................... 365/222 |
| 5,875,452 A | | 2/1999 | Katayama et al. .......... 365/233 |
| 6,151,269 A | * | 11/2000 | Dosaka et al. .............. 365/222 |
| 6,256,252 B1 | * | 7/2001 | Arimoto ...................... 365/222 |
| 6,256,707 B1 | * | 7/2001 | Ooishi ................... 365/189.12 |
| 6,341,097 B1 | | 1/2002 | Hsu et al. .................... 365/222 |
| 6,373,769 B1 | | 4/2002 | Kiehl et al. ................. 365/222 |
| 6,393,531 B1 | * | 5/2002 | Novak et al. .......... 365/189.12 |
| 6,460,120 B1 | | 10/2002 | Bass et al. ................... 711/148 |
| 2002/0071321 A1 | | 6/2002 | Barri et al. | |
| 2002/0138678 A1 | | 9/2002 | Kim et al. | |
| 2002/0141256 A1 | | 10/2002 | Barri et al. | |

* cited by examiner

*Primary Examiner*—Trong Phan
(74) *Attorney, Agent, or Firm*—Graham S. Jones; H. Daniel Schnurmann

(57) ABSTRACT

In a DRAM, which includes a plurality of memory banks, there is a pair of separate flag bit registers for each bank with the flag bit registers that are shifted up/down respectively. A comparator for each bank provides a comparator output. An arbiter for each bank is connected to receive a flag bit up signal and a flag bit down signal from the flag bit registers for that bank and the comparator output from the comparator for that bank. The arbiters are connected to receive a conflict in signal and to provide a conflict out signal. The pair of flag bit registers represent a refresh status of each bank and designate memory banks or arrays that are ready for a refresh operation.

20 Claims, 9 Drawing Sheets

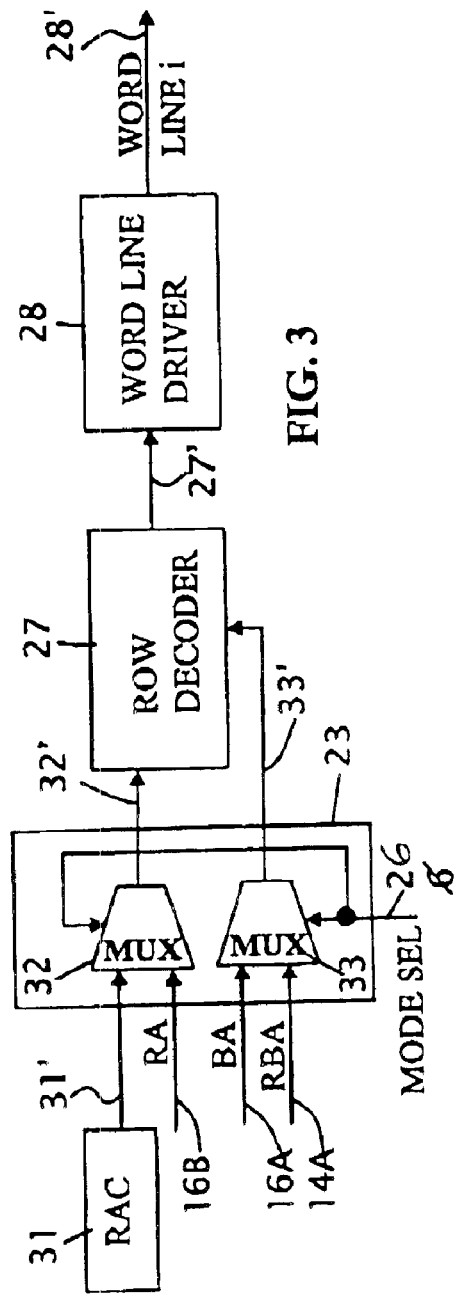
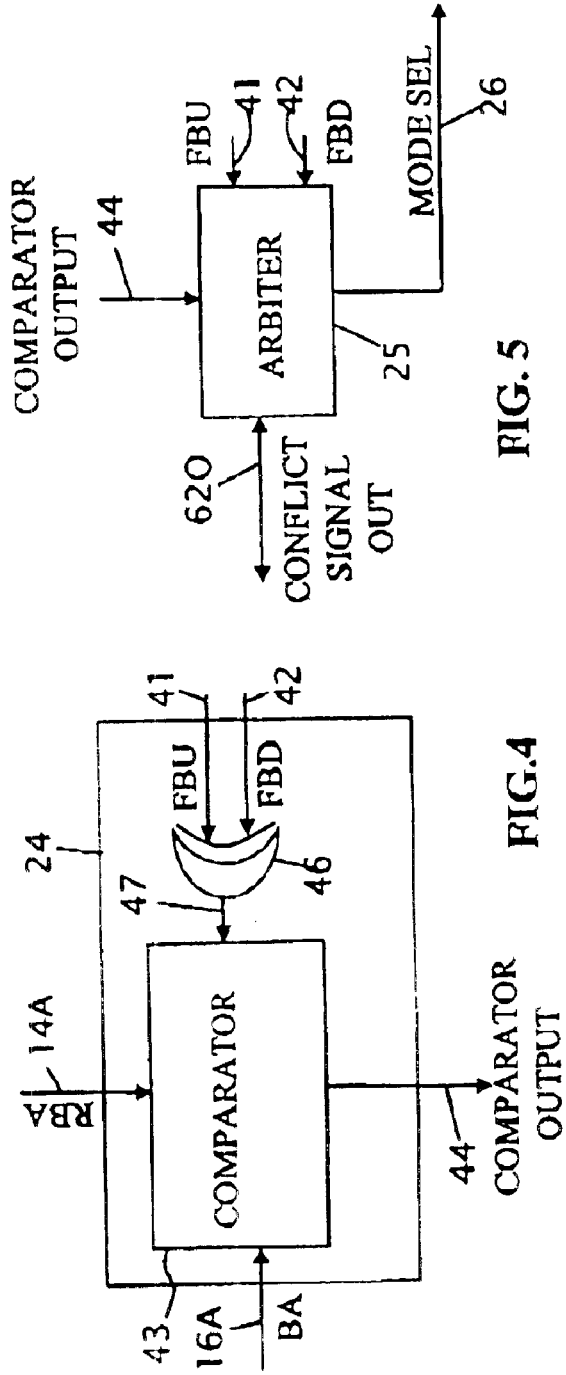
FIG. 3
FIG. 4
FIG. 5

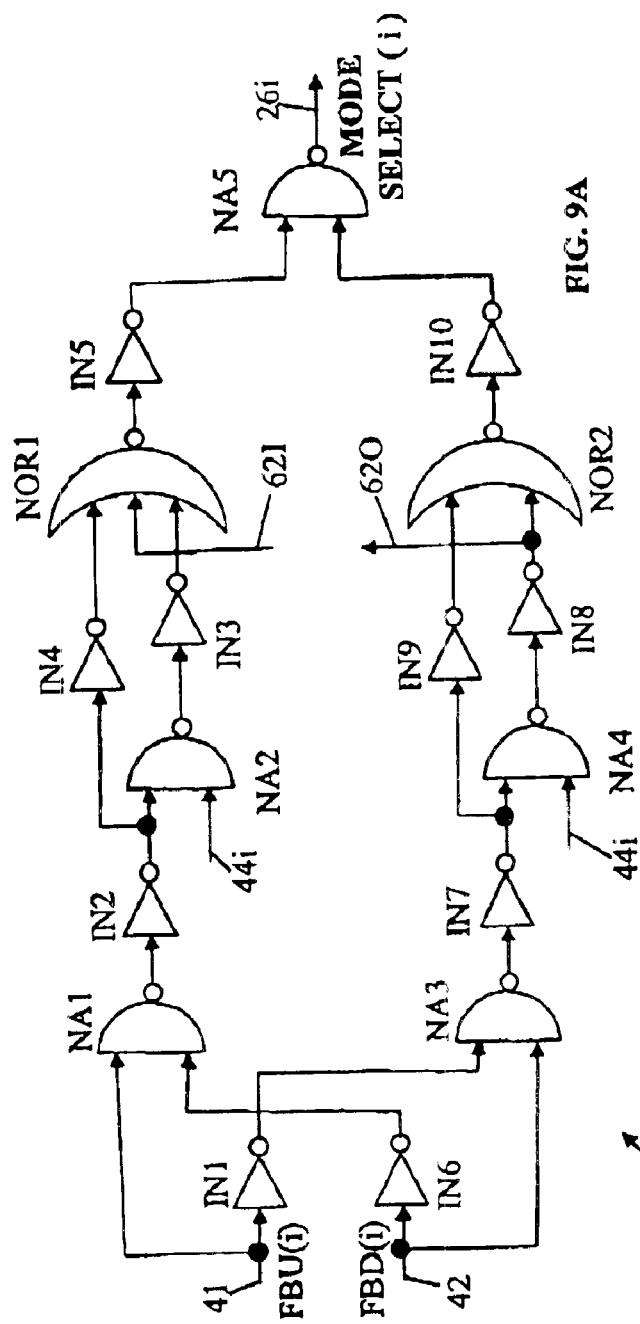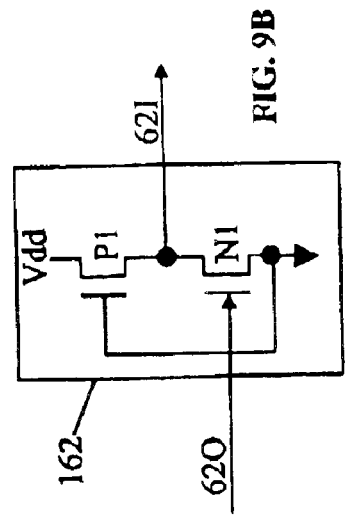
FIG. 9A
FIG. 9B

DYNAMIC RANDOM ACCESS MEMORY WITH SMART REFRESH SCHEDULER

BACKGROUND OF INVENTION

This invention relates to a Dynamic Random Access Memory (DRAM) devices, more particularly to logic technology based embedded DRAM devices.

As a solution to the problem of the manufacture of a System-on-Chip (SoC) type of device, use of an eDRAM device has numerous advantages over an embedded Static Random Access Memory (eSRAM). One of the biggest advantages of an eDRAM is the reduced area employed, roughly two to three times less than the area required by an eSRAM. However, the advantage of eDRAMs is diluted by the process complexity and the additional cost caused by the unique process of manufacturing DRAM devices. Therefore, both simplification of the manufacturing process and reduction of the cost of the manufacturing process are required concomitantly maintaining reduced area advantages. Use of logic technology based eDRAMs is such an example. Except for the process of capacitor fabrication, the processing is almost the same as for the logic process. Therefore, a relatively low threshold Cell Access Transistor (CAT) results in improvement of performance and removal of an additional mask step. But, a low threshold CAT will bring about a severe data retention problem because of its high leakage current. To compensate for data leakage, a more frequent data refresh operation is needed. More frequent data refresh operation gives rise to another performance degradation to system reducing memory availability.

SUMMARY OF INVENTION

To avoid or reduce data retention related issues, in accordance with this invention, a technique is provided and implemented. In some DRAMs, like SRAMs, the refresh operation is not seen by the user or the system while the refresh is being done internally. However, there is conflict between the normal DRAM access and the internal refresh. To manage this conflict, an intelligent scheduler is needed and in accordance with this invention, such a scheduler is provided.

An object of this invention is to provide a refresh scheduler book unit to manage the internal refresh operation of a DRAM memory without creating a conflict between the internal refresh function and the normal access function.

It is another object of this invention to provide an efficient refresh schedule algorithm that arbitrates the conflict between normal operation and internal refresh operation. It is also another object to implement the scheduling scheme for managing refresh operation by using the search algorithm that simplifies the circuit implementation and minimizes a penalty from scheduling.

This invention provides a smart refresh scheduler book unit that can handle or coordinate internal refresh operation and normal access operation. By doing so, the greater frequency of refresh operations caused by a leaky logic cell transistor can be hidden or invisible to the system. It greatly improves memory availability while using a very leaky cell device. The scheduler keeps the refresh status of each memory bank or array by using up/down shift registers and decides which bank to be refreshed. The search operation of this invention is fast and easy to implement.

The refresh bank search algorithm in this invention is feasible to implement and enables simple circuit implementation while minimizing the penalty caused by a refresh bank search operation.

In accordance with this invention a DRAM, which includes a plurality of memory banks (i.e. banks or arrays), there is a pair of separate flag bit registers for each bank with the flag bit registers that are shifted up/down respectively. A comparator for each bank provides a comparator output. An arbiter for each bank is connected to receive a flag bit up signal and a flag bit down signal from the flag bit registers for that bank and the comparator output from the comparator for that bank. The arbiters are connected to receive a conflict in signal and to provide a conflict out signal. The pair of flag bit registers represent a refresh status of each bank and designate memory banks or arrays that are ready for a refresh operation.

In accordance with another aspect of this invention, a dynamic random access memory (DRAM) with a plurality of memory banks (i.e. banks or arrays) including a refresh scheduler book unit is provided. The DRAM includes a pair of separate flag bit registers for each bank with the flag bit registers being shifted up/down respectively, a comparator for each bank which provides a comparator output, an arbiter for each bank connected to receive a flag bit up signal and a flag bit down signal from the flag bit registers for that bank and the comparator output from the comparator for that bank, the arbiters being connected to receive a conflict in signal and to provide a conflict out signal, and the pair of flag bit registers representing a refresh status of each bank and designating memory banks or arrays that are ready for a refresh operation, memory access sequencing means for providing a sequence of refresh operations, and a conflict signal generator included in each of said arbiters. Preferably, the DRAM includes an arbiter which coordinates refresh bank activation by combining comparator results and refresh bank activation priority schedule; and a row address counter (RAC) for each bank keeps the refresh history of each bank and generates a row address to be refreshed. Preferably, components comprising the refresh scheduler book unit are isolated from each bank and the refresh scheduler book unit sends to each bank both of a selected refresh bank address and refresh row address kept by row address counter. Preferably, all components except row address counter (RAC) are isolated from each bank or array and send to each bank or array a selected refresh bank address.

BRIEF DESCRIPTION OF DRAWINGS

The foregoing and other aspects and advantages of this invention are explained and described below with reference to the accompanying drawings, in which:

FIG. 3 shows the details of Row ADD MUX of FIG. 2 and Row Address Counter (RAC) and its connection to the Word Line Driver in accordance with this invention.

FIG. 4 shows the details of the structure of the comparator blocks shown in FIGS. 2A and 2B in accordance with this invention.

FIG. 5 shows the connections to a generic arbiter in accordance with this invention.

FIG. 9A shows a circuit diagram embodying the generic arbiter of FIG. 5.

FIG. 9B shows a conflict signal generator which is a component of the arbiter of FIG. 9A formed by a CMOS pair of PMOS and NMOS transistors. A "conflict out" signal is received at the gate electrode of the NMOS transistor from any one of the arbiters of the banks of the DRAM memory and a global "conflict in" signal is provided as the output at the source/drain node between the PMOS and NMOS transistors of the CMOS pair.

DETAILED DESCRIPTION

Figure 1:
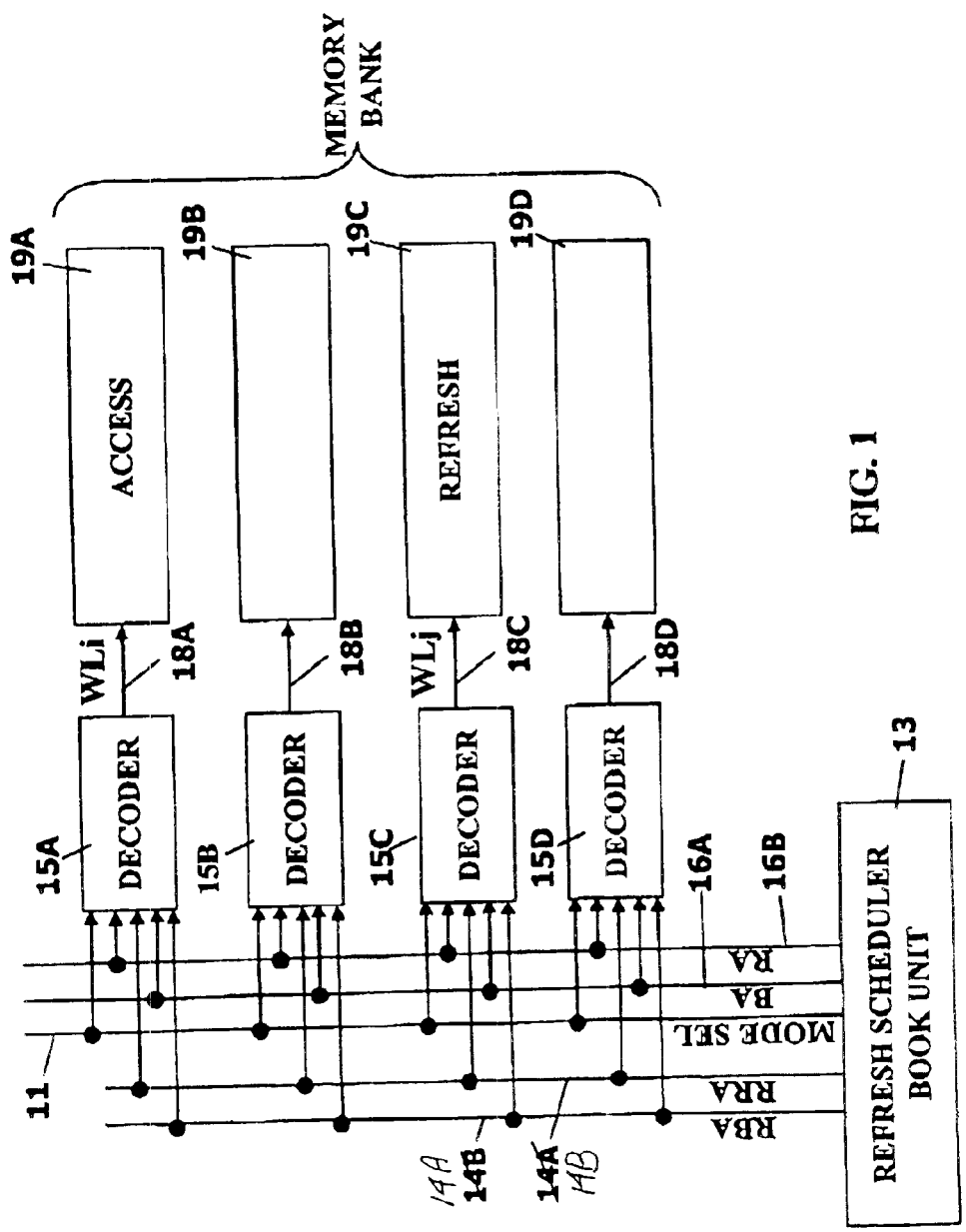
FIG. 1 shows a multi-bank or multi-array memory with four memory banks to illustrate the basic concept of this invention.

FIG. 1 shows a multi-bank or multi-array memory with four memory banks 19A–19D to illustrate the basic concept of this invention. In a multi-bank or multi-array memory with several banks 19A–19D in each cycle, only one bank or array is activated for the purpose of normal memory access while one or more of the other banks are activated for the purpose of being refreshed. Therefore, during each cycle, more than one bank or array is activated simultaneously. In FIG. 1 where two banks 19A/19C are activated at the same time, the first, ACCESS bank 19A is accessed for a normal read or a normal write operation, while a second, REFRESH bank 19C is refreshed. The decision as to whether or not a particular bank will be refreshed is done by a refresh scheduler book unit 13. The refresh scheduler book unit 13 manages the refresh schedule of every bank including ACCESS bank 19A, bank 19B, /REFRESH bank 19C and bank 19D or memory array and issues the global address on lines 14A (RBA), 14B (RRA) for a refresh operation while simultaneously bypassing normal access bank address lines including BA lines 16A and RA lines 16B issued externally by the user or system to row decoders 15A, 15B, 15C and 15D. On the one hand, lines 14B carry the RBA (Refresh Bank Address) signal and lines 16A carry the BA (Bank Address) signal respectively. Also, lines 14A carry the RBA (Refresh Bank Address) signal and lines 16B carry the RA (Row Address) signal. The refresh scheduler book unit 13 sends mode selection (mode SEL) signals on lines 11 together with the refresh address RA signals on lines 16B to the row decoders 15A to 15D. The mode selection signal lines 11 carry the information as to which address the row decoder 15A/15B/15C/15D of the selected bank including ACCESS bank 19A/bank 19B/REFRESH bank 19C/bank 19D should accept. The output of the decoder 15A on WLi line 18A is connected to the input of the ACCESS bank 19C. The output of the decoder 15B on line 18B is connected to the input of the bank 19B. The output of the decoder 15C on WLi line 18C is connected to the input of the REFRESH bank 19C. The output of the decoder 15D on line 18D is connected to the input of the bank 19D.

The role of the refresh scheduler book unit 13 is to arbitrate the possible conflicts between the incoming normal access address, and to decide which bank to refresh and track the refresh status of each bank.

Figure 2A:
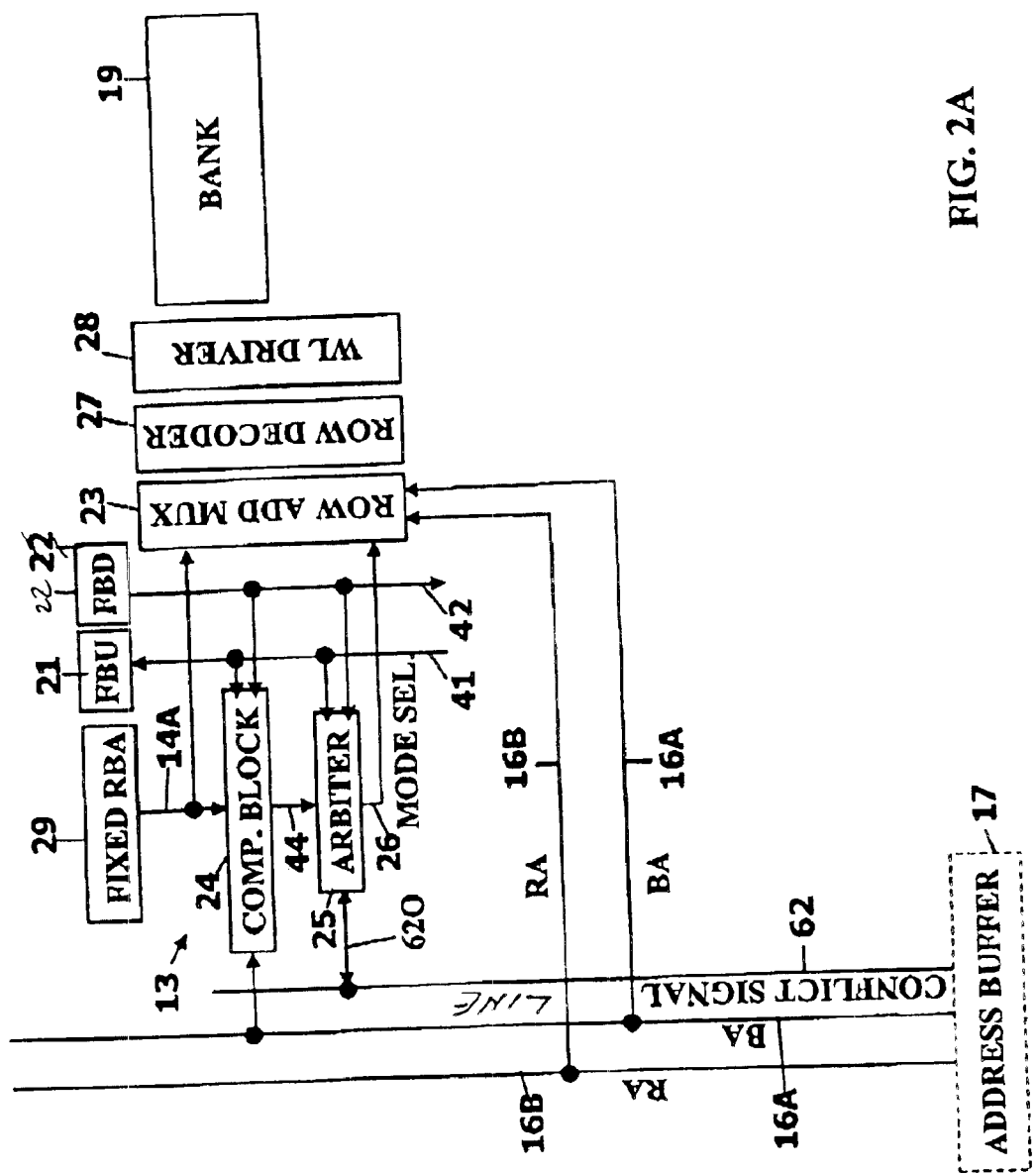
FIGS. 2A and 2B show block diagrams of key components of a system in accordance with this invention.
Figure 2B:
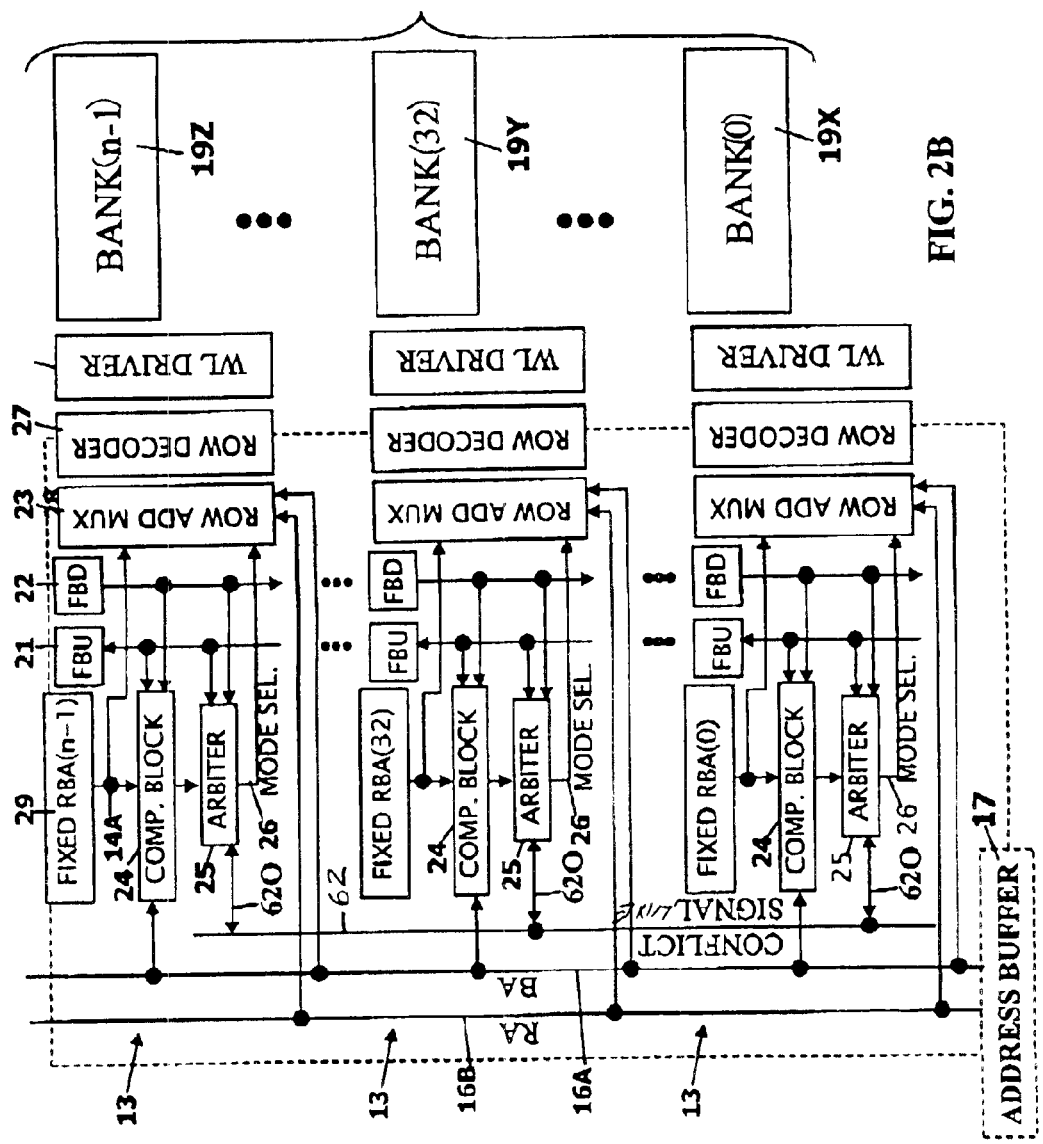

FIGS. 2A and 2B show block diagrams of key components of the system of this invention. FIG. 2A shows the connections for a single generic bank 19. In FIG. 2A, an address buffer 17 supplies the BA signals on lines 16A and the RA signals on lines 16B. Conflict signals between the address buffer 1 and an arbiter 25 are interconnected via conflict signal line 62 which connects from the address buffer and bidirectional line 62O which connects bidirectionally to the arbiter 25. A refresh scheduler book unit 13 in accordance with this invention comprises a Row ADDress MUltipleXer (Row ADD MUX) 23, up flag register FBU 21 and down flag register FBD 22, comparator block 24 and arbiter 25. A row address decoder 27, a wordline driver 28 and a Bank 19 are also shown in FIG. 2A, and the row address decoder 27, the wordline driver 28 and a Bank (n−1) 19Z are also shown in FIG. 2B. FIG. 2B also shows the additional banks Bank (32) 19Y and Bank (0) as part of an array of banks, as indicated by the dotted lines therebetween.

FIG. 2A shows a single block connection. FIG. 2B shows all connections among multiple banks, illustrating a preferred embodiment of this invention.

Referring to FIG. 2A, a Fixed RBA (Fixed Refresh Bank Address) register 29 is a uniquely assigned bank address to the shown bank through an output line 14A connected to both the comparator block 24 and the Row ADD MUX 23.

FIG. 4 shows the details of the structure of one of the comparator blocks 24 shown in FIGS. 2A and 2B. Each comparator block 24 receives two compare inputs, the incoming bank address from BA line 16A and the fixed bank address from RBA line 14A and two control inputs, FBU input 41 from FBU register 21 and FBD input 42 from FBD register 22. For each comparator block 24, the respective FBU register 21 and the respective FBD register 22 are connected to that comparator 24 and the corresponding arbiter 25. The FBU register 21 and the FBD register 22 each have a bit shifting capability. The actual connections of FBU register 21 and FBD register 22 are clearly shown in FIG. 2B and FIG. 4. All of FBUs in FIG. 2B are serially connected and shift the bit information of each FBU register 21 downwardly. Also, all of FBD registers 22 are serially connected and shift the bit information of each FBD register 22 upwardly.

The arbiter 25 also supplies Mode Select Signal on line 26 to the Row Add MUX 23 as shown in more detail in FIGS. 6 and 3.

A conflict signal line 62 is connected via line 62O (shown in FIGS. 2A, 2B, and 5) to send and receive conflict signals to and from the arbiter 25.

The BA signal on lines 16A is supplied to comparator block 24 and row address multiplexer 23. The RA signal on lines 16B is supplied to the row address multiplexer 23 only.

FIG. 2B shows three sets of circuits for a few exemplary banks BANK0 19X, BANK32 19Y, and bank BANK(n−1) 19Z out of n banks in an array thereof connected to lines 16A/16B and 62 as in FIG. 2A.

FIG. 3 shows the details of Row ADD MUX 23 of FIG. 2 and Row Address Counter (RAC) 31 and its connection to the Word Line Driver 28 which provides a "WORD LINE i" output on line 28'. It is comprised of RAC (Row Address Counter) counter 31 and two multiplexers comprising an upper MUX 32 and a lower MUX 33. Both the upper MUX 32 and the lower MUX 33 in FIG. 3 have a common input select signal, which is the selection signal, i.e. the Mode SEL signal on line 26 from the arbiter 25 as shown in FIGS. 2A, 2B and 6. The row decoder 27 receives an input on line 32' from the upper MUX 32 and another input on line 33' from the lower MUX 33. The row decoder 27 provides an input on line 27' to the wordline driver 28, which provides a WORD LINEi output on line 28'. The upper MUX 32 in FIG. 3 selects one out of two row address inputs, one on line 31' from RAC counter 31 and the other on RA line 16B from the address buffer 17 in FIGS. 2A and 2B. The RAC counter 31 provides the row address to be refreshed within each bank and automatically increases the row address therein after the selected bank is refreshed. The role of RAC 31 is to keep track of the refreshing process progressing from bank to bank by increasing the count in the respective RAC counter 31 whenever the bank is refreshed. The lower MUX 33 selects one bank address out of two bank address inputs, including BA input on lines 16A and RBA Inputs on line 14A. The two MUX units 32/33 select the refresh address or normal address depending on the Mode SEL signal polarity on line 26 from the refresh scheduler book unit 13.

The Mode SEL signal on line 26 determines whether a bank will be normally accessed or refreshed. If the incoming bank address on line 16A and the refresh bank address on RBA line 14A are the same, the Mode SEL signal on line 26 selects the incoming bank address (BA) on line 16A and row address (RA) on line 16B and the bank performs its Normal operation. On the other hand, if the incoming bank address (BA) on line 16A and the refresh bank address (RBA) on line 14A are not the same and when the decision to refresh the bank is made, the Mode SEL selects the refresh bank address (RBA) on line 14A and the RAC counter 31 provides an output via multiplexer 23 to the row decoder 27.

The flag registers FBU 21, FBD 22 of each bank indicate whether that bank is a candidate for a refresh operation. During every cycle, one FBU bit and one FBD bit have a valid flag bit. Accordingly, two banks are always candidates for a refresh operation. The comparator 43 in each bank which has a valid flag bit compares the incoming bank address for normal access with Fixed Refresh Bank Address. (Fixed RBA) on line 14B.

The comparator 43 in comparator block 24 in FIG. 4 compares the incoming bank address BA on line 16A that has passed through address buffer 17 in FIGS. 2A and 2B with the bank address of a candidate bank to be refreshed, i.e. the Fixed RBA on line 14B. If the two bank addresses are the same, it means the candidate bank is going to be accessed for normal read or write. Otherwise, the candidate bank can be refreshed. The output signal from the comparator 43 is sent on line 44 to the arbiter 25 and used to decide which bank is to be refreshed.

Referring again to FIG. 4, in more detail, the comparator block 24 of each bank is connected to the incoming bank address (BA) on line 16A, Fixed Refresh Bank Address (Fixed RBA) line 14B, FBU line 41 and FBD line 42. The FBU line 41 and FBD line 42 are connected to an Exclusive OR gate (XOR) 46. When the two flag bits are different, the comparator 43 can be enabled to generate a comparison result by the XOR 46 providing a high output online 47, but otherwise comparator 43 will be disabled because of a low input on line 47. In other words, a bank that has two valid different flag bits can be a candidate for a refresh operation. The flag registers of each bank are two bit registers, and each bit is connected serially with adjacent banks comprising shift register in up/down direction respectively. The flag bits are shifted or kept as every refresh operation is done.

FIG. 5 shows the connections to a generic arbiter 25. The arbiter 25 is connected to receive FBU and FBD bits on line 41 and 42 in each bank, comparator result on line 44 and conflict signal on the conflict signal line 62O. The arbiter 25 generates Mode SEL and conflict signal as outputs. The conflict signal on the conflict signal line 62O behaves as both an input and an output depending on flag bits. The arbiter 25 of a bank that has FBU "0" and FBD "1" will not take the conflict signal on the conflict signal line 62O as an input and instead bypass the comparator result on line 44 to conflict signal line 62. On the other hand, the arbiter 25 of the bank that has FBU "1" and FBD "0" will take the conflict signal on the conflict signal line 62O as an input without bypassing the comparator result from line 44 to the conflict signal line 62O.

Figure 6A:
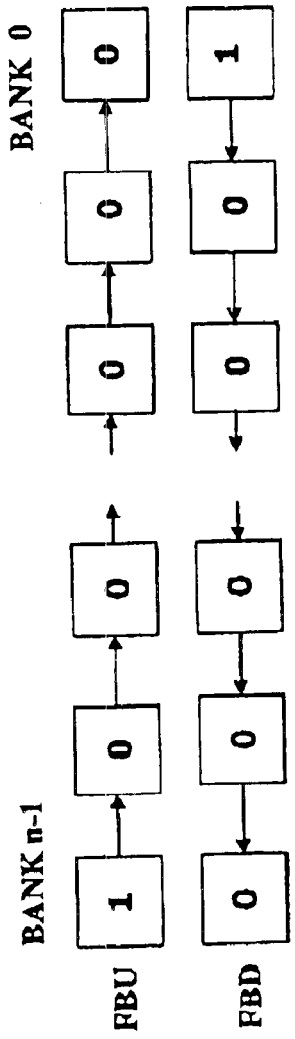
FIGS. 6A–6C show how the flag bits are changed in accordance with this invention.
Figure 6B:
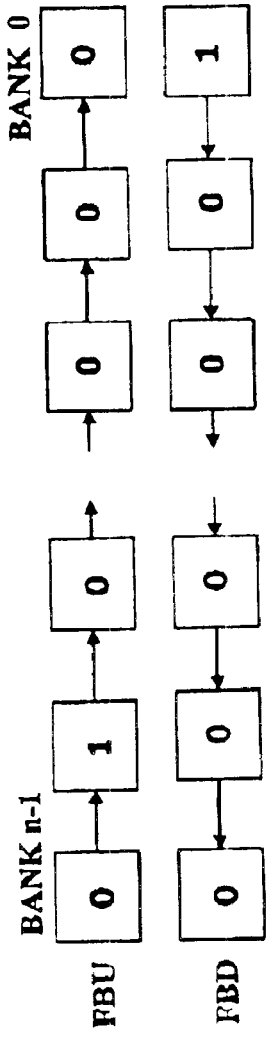
Figure 6C:
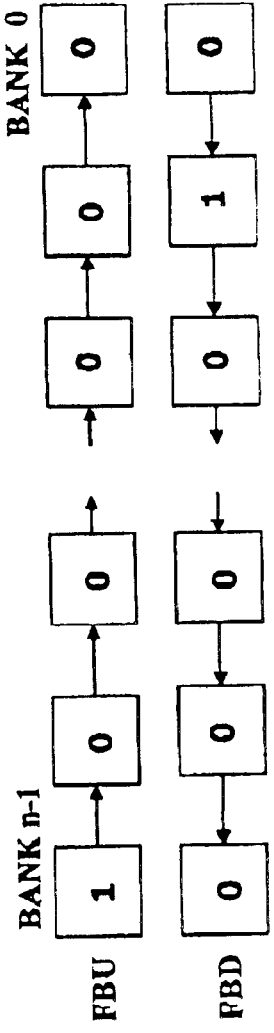

FIGS. 6A–6C show how the flag bits are changed. FIG. 6A shows the initial condition of the flag bits. FBU of bank n−1 and FBD of bank 0 are set to "1" and the rest of FBU and FBD are set to "0". This means that two banks, "n−1" bank 19Z and "0" bank 19X in FIG. 2B, are candidates for refresh operations. A selected "n−1" bank 19Z or "0" bank 19X is to be refreshed and the corresponding FBU or FBD bit is shifted by one bit. If the "n−1" bank 19Z were refreshed, FBU "1" at If "n-l" bank 19Z is shifted to bank n−2 as shown in FIG. 6B.

FIG. 6C shows another situation where "0" bank 19X is refreshed and FBD "1" of "0" bank 19X is shifted to bank 1 (not shown).

In this invention, referring to FIGS. 6A, 6B and 6C refresh bank selection is done by a binary search. Initially, two banks, the uppermost one of FBU in FIG. 6A and bottom one of FBD in FIG. 6A, have flag bit "1". There are some different scenarios depending on incoming bank address and refresh bank selection priority. First, if the incoming bank address matches one of two bank addresses, the unmatched bank is selected for refresh. Simultaneously, the flag bit "1" of the selected bank is shifted downward or upward while the flag bit "1" of the unselected bank is being kept at the same place. Second, if the incoming address does not match with two refresh candidate bank addresses, the bank that has the refresh bank selection priority determined by arbiter 25 will be selected and shift the flag bit "1". This refresh bank selection operation will be continued until all of the banks are refreshed.

Figure 6D:
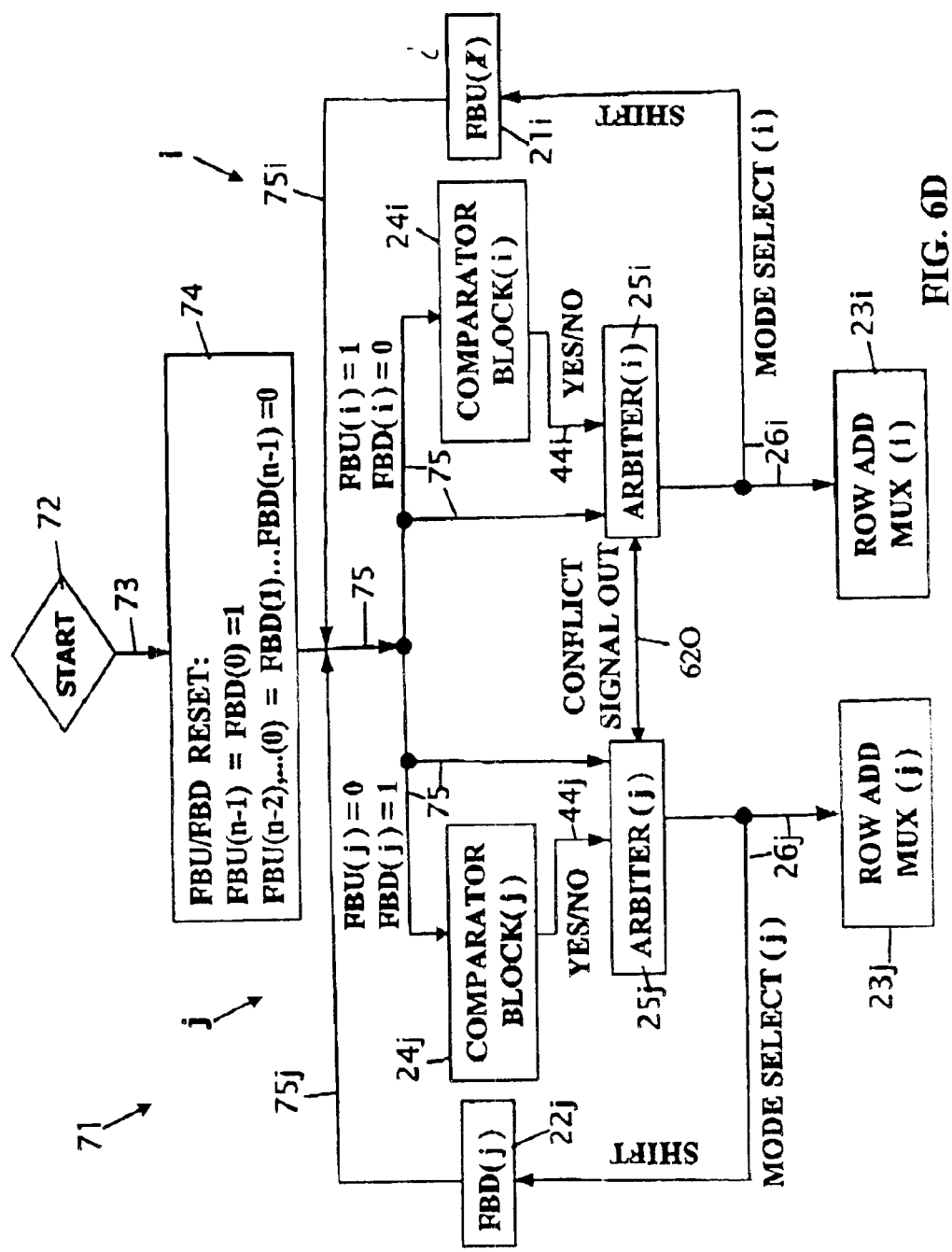
FIG. 6D shows a hybrid form of flowchart of an algorithm, signal, and devices, in accordance with the invention and FIGS. 6A–6C.

FIG. 6D shows a hybrid form of flowchart 71 of an algorithm, signal, and devices, in accordance with the invention and FIGS. 6A–6C, which operates as follows:

1. At the start 72 of the algorithm, the program proceeds along line 73 to block 74 to perform a memory access sequence, wherein all of the flag bit registers FBU 21 and FBD 22 are reset as follows:
FBU(n−1)=FBD(0)=1;
FBU(n−2) . . . (0)=FBD(1) . . . FBD(n−1)=0
All FBUs and FBDs except FBU(n−1) and FBD(O) are reset to 2. The outputs of reset block 74 on line 75 including FBU(j)=0, FBD(j)=1, FBU(i)=1, and FBD(i)=0 flow as shown by FIG. 6D to comparator block(i) 24$i$, comparator block 24$j$, arbiter(i) 25$i$ and arbiter(j) 25$j$.

The bank j flag bit information is FBU(j)=0, FBD(j)=1, enables comparator block(j) 24$j$ and compares the incoming Normal access bank (BA) address on line 16A with the fixed refresh bank address (RBA) on line 14A as explained above in connection with FIG. 4. The result (output) which is a YES/NO signal on line 44$j$ from comparator block(i) 24$j$ is input to Arbiter(j) 25$j$.

The arbiter(j) 25$j$ is also enabled by the input signal combinations, FBU(j)=0 and FBD(j)=1 on line 75 from step 74 in the program and receives the comparator output j on line 44$j$ and generates a conflict signal on line 62O as an output from the arbiter 25$j$ which is supplied as an input to the arbiter 25$i$. Arbiter 25$i$ provides a mode select (i) output on line 26$i$ to ROW ADD MUX (i) 23$i$ and the shift input to FBU(i) 21$i$; and arbiter 25$j$ provides a mode select output on line 26$j$ to ROW ADD MUX (i) 23$i$ and the shift input to FBU(i) 22 as explained in connection with generic arbiter 25 in FIG. 5, which provides a generic output on MODE SEL line 26. If the output from comparator block 24$j$ is "YES", the mode select j signal transmitted on line 26*j* is "1" which shifts FBD(0) . . . (n–1) by 1 bit upward from LSB to MSB on line 75*j* to line 75.

If the output from comparator block 24*j* is "NO", the conflict signal is "1" and sent on line 62*j* to bank i as an input to Arbiter 25*i*.

This keeps the Mode select j on shift line 26*j* to the FBD(j) 22*i* at "0" on line 75*j* to line 75 and does not change the register pattern FBD(0) . . . (n–1).

Arbiter(i) 25*i* is enabled by the input signal combinations, FBU(i)=1 and FBD(i)=0 on line 75 and receives an output from comparator block(i) 24*i* on line 44*i* and the conflict signal from arbiter(j) 25*j* on line 62O as inputs.

If the output from comparator block(i) 24*i* on line 44*i* is "YES" and the conflict signal on line 62O is "1", the Mode select(i) output on line 26*i* from arbiter(i) 25*i* is "1" supplied on mode select (i) line 26*i* to FBU(J) 21*i*, which is a shift signal into FBU(n–1) . . . FBU(0) by 1 bit downward from MSB to LSB.

If the output of comparator block 24*i* is "NO", then the Mode select(i) value on line 26*i* from arbiter(i) 25*i* is "0".

5. The mode select signals i and j on lines 26*i* and 26*j* are inputs to ROW ADD MUX blocks 23*i* and 23*j* as indicated by generic ROW ADD MUX 23 shown in FIG. 3 and the selected addresses will fire corresponding word lines.

6. In the next cycle, the shifted or non-shifted FBU and FBD values on lines 75*i* and 75*j* are inputs to the comparator blocks 24*i*, 24*j* and the arbiters 25*i*, 25*j*.

Following the bank selection algorithm above, in multiple n banks, any 1 out of n (1/n) bank is busy for normal access but (n–1) out of n banks (n–1/n) are idle for refresh at the first cycle. Next cycle, 1/n bank is busy but (n–2) out of (n–1) (n–2/n–1) is idle for refresh. At the (n–1) cycle, any 1/n bank is busy and 1 out of 2 is idle for refresh. Finally, only one bank is not refreshed yet after (n–1) cycles. The refresh scheduler book unit 13 handles memory bank selection effectively while reducing complexity from the refresh scheduler book unit 13.

The arbiters 25*i*/25*j* mediate the conflict between two candidate banks and decides which bank is to be refreshed. The arbitration is done through two flag bit information and common conflict signals. The comparator results of two candidate banks are shared through arbiters 25*i*/25*j* connected to receive signals on common conflict signal out line 62O. When two candidate banks are available for a refresh operation, one of two banks is selected through arbitration following the given priority. In accordance with this invention, the priority is given to the bottom side bank. The "bottom side" refers to the bank FBD(j)=1 and FBU(j)=0, i.e. searched from bank "0". The "upper side" refers to the bank that has FBD(j)=0 and FBU(j)=0, i.e. searched from bank "n–1".

In FIG. 2B, all of the key components of the refresh scheduler book unit 13 are distributed to each bank i, j, etc. Only the communication channels, such as conflict signal and bank address are distributed over all memory banks.

Figure 7:
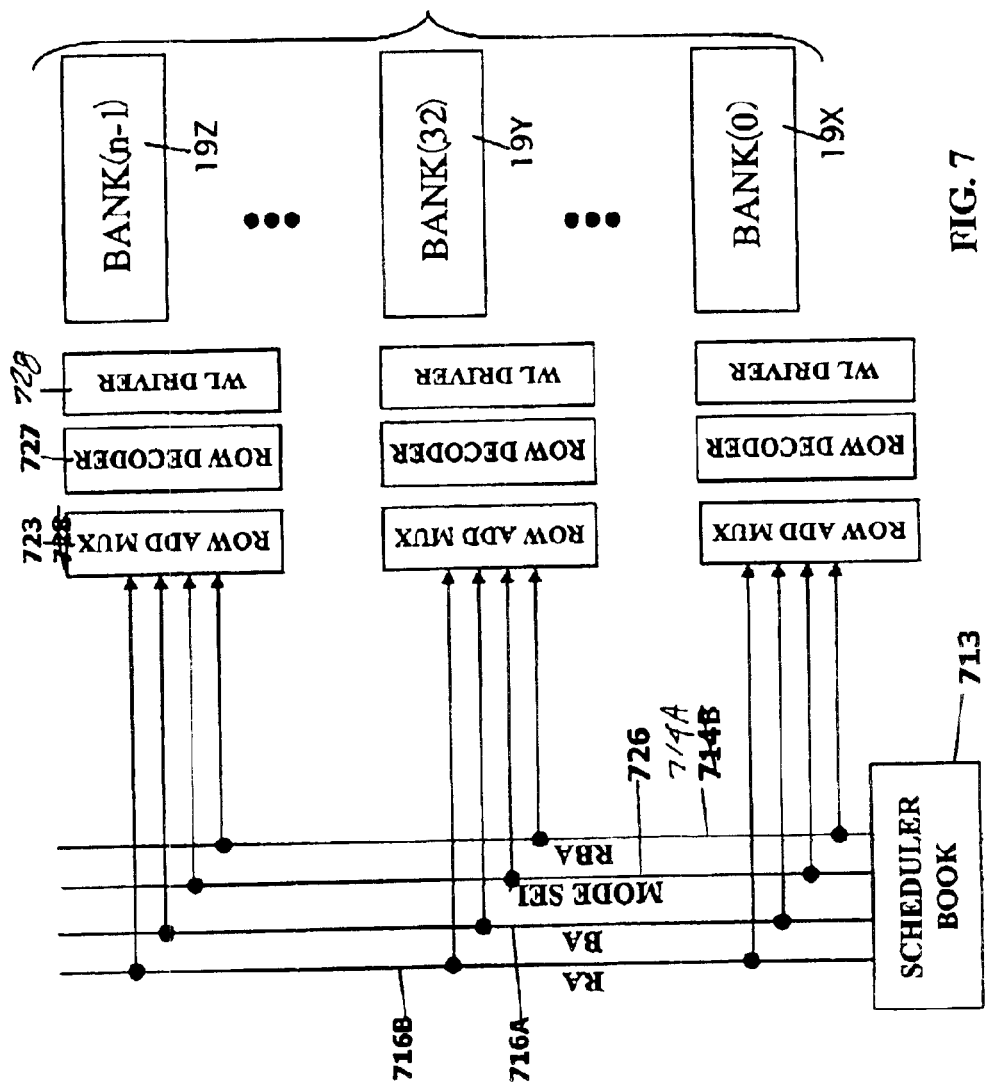
FIG. 7 shows an alternative to the embodiment of FIG. 2B that is similar to FIG. 1.

FIG. 7 shows an alternative to the embodiment of FIG. 2B that is similar to FIG. 1. All of the key components of the refresh scheduler book unit 713 in FIG. 2 except Row Address MUX 23 are collected into one place in the refresh scheduler book unit 713 and only a selected refresh bank address 714A is sent to each bank 19X, 19Y and 19Z together with access bank address on line 716A. The refresh scheduler book unit 713 is connected to RBA line 714A. BA line 716A. RA line 716B, and MODE SEL line 726, which are connected to Row Add MUX unit 723, among others. The ROW ADD MUX unit 23 is associated with Row Decoder 727 and WL Driver 728 and BANK (n–1) 19Z, that are analogous to the row address decoder 27, the wordline driver 28 and the BANK (n–1) 19Z in FIG. 2B. FIG. 7 also shows the additional banks Bank (32) 19Y and Bank (0) as part of an array of banks, as indicated by the dotted lines therebetween.

Figure 8:
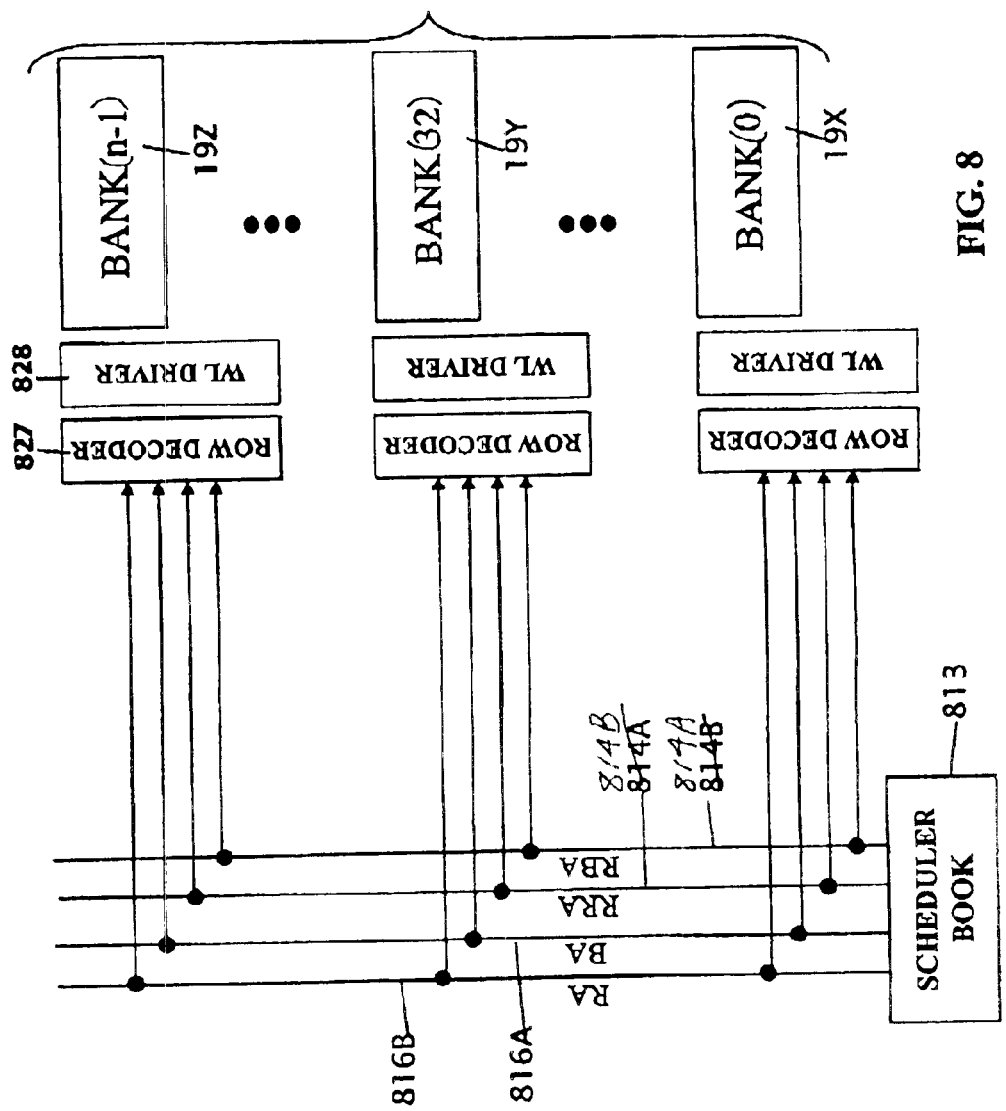
FIG. 8 shows an alternative of the embodiment of FIG. 5.

FIG. 8 shows an alternative of the embodiment of FIG. 2B. All of the key components of the refresh scheduler book unit 813 (as with the refresh scheduler book unit 13 in FIG. 2) including RAC 31 are collected into one place in the refresh scheduler book unit 813 and the selected refresh bank address (RBA) 814A and refresh row address (RRA) 814B are sent to each bank 19X, 19Y and 19Z together with normal address 816B and bank address on line 816A. Refresh scheduler book unit 813 is connected to RBA line 814A, RRA line 814B, BA line 816A, and RA line 816B, that are connected to Row Decoder 827, among others. Row Decoder 827 is associated with WL Driver 828 and BANK (n–1) 19Z. FIG. 8 also shows the additional banks Bank (32) 19Y and Bank (0) as part of an array of banks, as indicated by the dotted lines therebetween.

FIG. 9A shows a circuit diagram 25 embodying the arbiter 25*i* of FIG. 6D for the bank (i) of the DRAM memory device of this invention.

FIG. 9B shows a conflict signal generator 162 which is a component of each generic arbiter 25 of FIGS. 5 and 9A (separate from the arbiter 25 of FIG. 9A for convenience of illustration) comprising a CMOS pair of PMOS and NMOS transistors P1/N1. A "conflict out" signal is received on line 62O (from any one of the arbiters of the DRAM memory) at the gate electrode of the NMOS transistor N1 of arbiter 25*i* of FIG. 6D from an arbiter 25*j* in FIG. 6D of the previous bank "j".

A global "conflict in" signal is provided at the common drain node on line 62I as the output between the PMOS and NMOS transistors of the CMOS pair which is to be supplied to a next lowest arbiter which is not shown in FIG. 6D, for convenience of illustration. The source of the PMOS transistor P1 is connected to power supply voltage Vdd. The source of the NMOS transistor N1 and the gate of the PMOS transistor P1 are connected to ground.

Referring to FIG. 9A, FBU(i) and FBD(i) on lines 41 and 42 are from the flag bit registers of each bank. The comparator(i) input on line 44*i* is the comparator result of each bank.

Signal FBD(i) on line 41 and inverted signal FBU(i) on line 42 from inverter IN1 are the two inputs to a two input NAND gate NA3, the output of which is inverted by inverter IN7. The output of inverter IN7 together with comparator result(i) on line 44*i* are the two inputs to two input NAND gate NA4. The NAND gate NA4 generates an output which is inverted by an inverter IN8, which produces a conflict output(i) signal on line 62O as well as an input to a two input NOR gate NOR2.

The conflict output(i) signal on line 62O from IN8 (just described above) and the output of NAND gate NA3 which has been inverted twice by inverters IN7 and IN9 are the two inputs to the two input NOR gate NOR2. The output of the NOR late NOR2 is inverted by an inverter IN10, which provides one of two inputs to a NAND gate NA5, which decides whether Mode SEL(i) is "0" or "1".

On the other hand, the input signal FBU(i) on line 41 and the input signal FBD(i) on line 41, which has been inverted via inverter IN6 are two inputs to another two input NAND gate NA1, which supplies an input to inverter IN2. The output of inverter IN2, which on the one hand is inverted by inverter IN4, supplies one input to a three input NOR gate NOR1. On the other hand the output of inverter IN2 together with comparator result(i) on line 44$i$ are inputs to NAND sate NA2 which provides an output that is inverted by inverter IN3 which provides another input to the three input NOR state NOR1. The "conflict in" line 62I from the conflict signal generator 162 in FIG. 9A is a third input to NOR gate NOR1. The output of the three input NOR gate NOR1 passes through inverter IN5 to the other input to two input NAND gate NA5, which, as stated above, decides the Mode SELECT(i) output on line 26$i$.

Referring to the conflict signal generator 162 shown in FIG. 9B, the conflict out(i) signal on line 62O from inverter IN8 in FIG. 9A is connected to the gate of NFET N1 and generates the "conflict in" signal on line 62I in FIGS. 9A and 9B which is a global signal and input to the three input NOR gate NOR1.

The functions of the circuits of FIGS. 9A and 9B are as follows:

FBU(i)="0";
FBD(i)="1";
Comparator(i)="1": generates conflict out "1" and keep Mode SEL "0" selecting the normal access address;
FBU(i)="0";
FBD(i)="1";
Comparator(i)="0": keeps conflict out "0" and sets Mode SEL "1" selecting the refresh address.
FBU(i)="1";
FBD(i)="0";
Comparator(i)="0".
1) if conflict in is low, sets Mode SEL "1" selecting refresh address.
2) if conflict in is high, keeps Mode SEL "0" selecting the normal access address;
FBU(i)="1";
FBD(i)="0";
Comparator(i)="1": keeps Mode SEL "0" selecting the normal access address.
FBU(i)="0";
FBD(i)="0";
Comparator(i)="1", or "0": Regardless of comparator result, Mode SEL is "0" selecting the normal access address.

Many alternatives can be possible in terms of placement of each key component. Accordingly, the present invention is intended to embrace all such alternatives as fall within the following claims.

Having thus described the invention, what is claimed as new and desirable to be secured by Letters Patent is as follows.

What is claimed is:

1. A dynamic random access memory (DRAM) with a plurality of memory banks comprising:
   a pair of separate flag bit registers for each bank with the flag bit registers being shifted up/down respectively, a comparator for each bank which provides a comparator output,
   an arbiter for each bank connected to receive a flag bit up signal and a flag bit down signal from the flag bit registers for that bank and the comparator output from the comparator for that bank,
   the arbiters being connected to receive a conflict in signal and to provide a conflict out signal, and
   the pair of flag bit registers representing a refresh status of each bank and designating memory banks or arrays that are ready for a refresh operation.

2. The DRAM of claim 1 wherein the comparators compare a refresh bank address with an incoming normal access bank address and sends the comparator output result to a conflict signal generator to which all arbiters are connected.

3. The DRAM of claim 1 wherein the arbiter coordinates refresh bank activation by combining comparator results and refresh bank activation priority schedule.

4. The DRAM of claim 2 wherein the arbiter coordinates refresh bank activation by combining comparator results and refresh bank activation priority schedule.

5. The DRAM of claim 1 wherein a row address counter (RAC) for each bank keeps the refresh history of each bank and generates a row address to be refreshed.

6. The DRAM of claim 1 wherein memory access sequencing means provides a sequence of refresh operations.

7. A dynamic random access memory (DRAM) with a plurality of memory banks including a refresh scheduler book unit comprising:
   a pair of separate flag bit registers for each bank with the flag bit registers being shifted up/down respectively, a comparator for each bank which provides a comparator output,
   an arbiter for each bank connected to receive a flag bit up signal and a flag bit down signal from the flag bit registers for that bank and the comparator output from the comparator for that bank,
   the arbiters being connected to receive a conflict in signal and to provide a conflict out signal, and
   the pair of flag bit registers representing a refresh status of each bank and designating memory banks or arrays that are ready for a refresh operation.

8. The DRAM of claim 7 wherein the comparators compare a refresh bank address with an incoming normal access bank address and sends the comparator output result to a conflict signal generator to which all arbiters are connected.

9. The DRAM of claim 7 wherein the arbiter coordinates refresh bank activation by combining comparator results and refresh bank activation priority schedule.

10. The DRAM of claim 8 wherein the arbiter coordinates refresh bank activation by combining comparator results and refresh bank activation priority schedule.

11. The DRAM of claim 7 wherein a row address counter (RAC) for each bank keeps the refresh history of each bank and generates a row address to be refreshed.

12. The DRAM of claim 7 wherein components comprising the refresh scheduler book unit are distributed within each bank and communicates through a conflict signal generator that is connected to the comparator and the arbiter.

13. The DRAM of claim 7 wherein components comprising the refresh scheduler book unit are isolated from each bank and the refresh scheduler book unit sends to each bank both of a selected refresh bank address and refresh row address kept by row address counter.

14. The DRAM of claim 7 wherein all components except row address counter (RAC) are isolated from each bank or array and send to each bank or array a selected refresh bank address.

15. The DRAM of claim 7 wherein memory access sequencing means provides a sequence of refresh operations.

16. A dynamic random access memory (DRAM) with a plurality of memory banks including a refresh scheduler book unit comprising:

a pair of separate flag bit registers for each bank with, the flag bit registers being shifted up/down respectively, a comparator for each bank which provides a comparator output, an arbiter for each bank connected to receive a flag bit up signal and a flag bit down signal from the flag bit registers for that bank and the comparator output from the comparator for that bank, the arbiters being connected to receive a conflict in signal and to provide a conflict out signal, and the pair of flag bit registers representing a refresh status of each bank and designating memory banks or arrays that are ready for a refresh operation, memory access sequencing means for providing a sequence of refresh operations, and a conflict signal generator included in each of said arbiters.

17. The DRAM of claim 16 wherein the arbiter coordinates refresh bank activation by combining comparator results and refresh bank activation priority schedule.

18. The DRAM of claim 16 wherein a row address counter (RAC) for each bank keeps the refresh history of each bank and generates a row address to be refreshed.

19. The DRAM of claim 16 wherein components comprising the refresh scheduler book unit are isolated from each bank and the refresh scheduler book unit sends to each bank both of a selected refresh bank address and refresh row address kept by row address counter.

20. The DRAM of claim 16 wherein all components except row address counter (RAC) are isolated from each bank or array and send to each bank or array a selected refresh bank address.

* * * * *